United States Patent [19]

Gheewalla

[11] Patent Number: 5,723,883

[45] Date of Patent: Mar. 3, 1998

[54] GATE ARRAY CELL ARCHITECTURE AND ROUTING SCHEME

[75] Inventor: Tushar R. Gheewalla, Los Altos, Calif.

[73] Assignee: In-Chip, Los Altos, Calif.

[21] Appl. No.: 557,474

[22] Filed: Nov. 14, 1995

[51] Int. Cl.$^6$ .............................. H01L 27/10; H01L 23/48
[52] U.S. Cl. .......................... 257/204; 257/211; 257/758
[58] Field of Search ................................ 257/204, 211, 257/758

[56] References Cited

U.S. PATENT DOCUMENTS

| | | | |
|---|---|---|---|
| 4,611,236 | 9/1986 | Sato | 357/45 |
| 4,649,294 | 3/1987 | McLaughlin | 307/446 |
| 4,668,972 | 5/1987 | Sato et al. | 357/42 |
| 4,682,201 | 7/1987 | Lipp | 357/42 |
| 4,727,266 | 2/1988 | Fujii et al. | 307/443 |
| 4,804,868 | 2/1989 | Masuda et al. | 307/446 |
| 4,816,887 | 3/1989 | Sato | 357/42 |
| 4,884,118 | 11/1989 | Hui et al. | 357/45 |
| 5,038,192 | 8/1991 | Bonneau et al. | 357/45 |
| 5,079,614 | 1/1992 | Khatakhotan | 357/42 |
| 5,095,352 | 3/1992 | Noda et al. | 257/211 |
| 5,177,575 | 1/1993 | Ikeda | 257/503 |
| 5,245,202 | 9/1993 | Yasukazu | 257/331 |
| 5,309,015 | 5/1994 | Kuwata et al. | 257/211 |
| 5,341,041 | 8/1994 | El Gamal | 307/446 |
| 5,497,023 | 3/1996 | Nakazato et al. | 257/394 |
| 5,517,061 | 5/1996 | Azmanov | 257/211 |
| 5,523,598 | 6/1996 | Watanabe et al. | 257/390 |

OTHER PUBLICATIONS

A. Hui et al., A 4.1 Gates Double Metal HCMOS Sea of Gates Array, *IEEE 1985 Custom Integrated Circuits Conference*, CH2157–6/85/0000–0015.

A. El Gamal et al., *BiNMOS: A Basic Cell for BiCMOS Sea-of-Gates*, 1989 IEEE Custom Integrated Circuits Conference, paper No. 8.3.1.

C. Yao et al., *An Efficient Power Routing Technique to Resolve the Current Crowding Effect in the Power Grid Structure of Gate Arrays*, 1994 IEEE 7th Annual ASIC Conference, Rochester, 0–7803–2020–4/94.

Y. Okuno et al., *0.8 um 1.4MTr. CMOS SOG Based on Column Macro-cell*, IEEE 1989 Custom Integrated Circuits Conference, CH2671–6/89/0000–0036.

*Primary Examiner*—Tom Thomas
*Assistant Examiner*—Fetsum Abraham
*Attorney, Agent, or Firm*—Townsend and Townsend and Crew LLP; Kenneth R. Allen

[57] ABSTRACT

A CMOS cell architecture and routing method optimized for three or more interconnect layer cell based integrated circuits such as gate arrays is disclosed. Improved provisioning of routing resources and cell layout optimize routability and significantly reduce cell size. First and second layer interconnect lines are disposed in parallel and are used as both global interconnect lines and interconnect lines internal to the cells. Third layer interconnect lines extend orthogonally to the first two layer interconnects and can freely cross over the cells. Non-rectangular diffusion regions, shared gate electrodes, judicious placement of substrate contact regions, and the provision for an additional small transistor for specific applications are among numerous novel layout techniques that yield various embodiments for a highly compact and flexible cell architecture. The overall result is significant reduction in the size of the basic cell, lower power dissipation, reduced wire impedances, and reduced noise.

20 Claims, 10 Drawing Sheets

GATE ARRAY CELL ARCHITECTURE AND ROUTING SCHEME

BACKGROUND OF THE INVENTION

The present invention relates in general to cell based integrated circuits such as gate arrays, and in particular to an improved cell architecture and routing scheme for such circuits.

Standard cell or gate array technology have been developed as quick-turn integrated circuit (IC) design methodologies in which pre-designed circuit units or cells (e.g., NAND and NOR gate, Flip-Flops, etc.) are wired together to rapidly implement a new IC functionality. The pre-designed circuit elements are called macro cells which are made by interconnecting basic cells. The design and characteristics of the macro cells typically do not change from one design to the next. It is how these macro cells are interconnected that varies depending on the functionality being implemented.

The interconnect layers in gate arrays perform two functions: they connect basic cells to form macro cells, and, they interconnect macro cells using global routes to implement the desired IC function. A balanced allocation of routing resources is necessary between the need to minimize the area occupied by macro cells and the need to provide sufficient global routing resources to interconnect the maximum number of macro cells on an IC.

The present gate array technology has evolved from two levels of interconnect. The two levels of routing resources have typically been used in orthogonal directions to achieve the highest circuit density. The first and second level routing resources are generally called M1 and M2 respectively. FIG. 1 shows a two level routing scheme according to prior art where M1 tracks 11 are used to route horizontal X direction, and M2 tracks 12 are used in the vertical Y direction. As the technology evolved to three or more levels of interconnect layer, the orthogonality of neighboring levels has been maintained in the prior art. So the third layer M3 is routed in the X direction, parallel to M1 and orthogonal to M2, etc.

The circuit functionality is obtained by interconnecting macro cells 13 which represent different logic functions such as NAND, NOR, Latch, etc. The macro cells 13 are designed to use as much internal M1 routing 14 as possible with occasional use of internal M2 tracks 15, when M1 alone is not sufficient. This arrangement allows many of the M2 global routes 12 to cross over macro cells 13 as shown in FIG. 1. Global M1 tracks 11 in general can not cross over macro cell so they have to be routed adjacent to the macro cells. A third interconnect layer M3 and subsequent interconnect layers can cross over macro cells as long as the macro cells do not use those layers for internal routing. Therefore, the basic cells must be designed with the necessary number of M1 tracks required for internal routing of macro cells. For most frequently used CMOS gate array basic cells, a typical number is about 12.

Furthermore, in the case where a third level of interconnect M3 is available, the prior art approach as shown in FIG. 1 typically uses first and third interconnect layers M1 and M3 in parallel, while the second interconnect layer M2 is disposed orthogonal to them. In the prior schemes, the second interconnect layer M2 is typically used for global routing, power distribution and routing internal to the macro cells. Therefore, there are less global routing tracks available in the M2 direction than M3, causing an imbalanced situation with respect to routing resources. In such cases, the routability of the designs is limited by the M2 tracks.

FIG. 2 shows a prior art basic cell from U.S. Pat. No. 4,884,118 issued to Hui et al., and assigned to LSI Logic Corporation. The basic cell consists of a P-type diffusion region 21 and an N type diffusion region 22, gate electrodes 23, and contact regions 24 for contacting the transistor source/drain/gate terminals. The basic cell also contains regions 28 for contacting the P and N type substrate. Twelve M1 tracks 25 and 29 are provided in the X direction for macro cell routing. Specific M1 tracks 29 are used to connect power supply voltages Vdd and Vss to the transistors. In the Y direction, three M2 tracks 26 are provided for global routing and an additional track 27 for further power supply connection. Track 27 is shared between two adjacent basic cells.

A 2-input NAND gate can be formed from a single basic cell as shown in FIG. 3. First layer tracks 32 and 33 connect Vdd and Vss to the 2-input NAND macro cell. First layer 34 is used to connect two P-type transistor to one N-type transistor. Connections 31 are used to connect the gate electrodes. Vdd and Vss also contact to the substrate via contacts 35. The inputs and output of the 2-input NAND are interconnected to other gates using global routes.

Larger functions such as a 4-input NAND gate or a D-Flip-flop require more than one basic cell. An example of a large macro cell 41 containing six basic cells is shown in FIG. 4. All of the basic cells are arranged in the X direction. First level M1 layer is used to interconnect basic cells in both X, as well as Y directions within the macro cell 41. Therefore, first level global routes 44 can be placed only outside of the macro cell. However, second layer internal tracks 43 are used only sparingly inside a macro cell and that also only in the vertical direction. Thus, many of the second layer global routes are free to run through the macro cell in places where there is no second layer blockage, such as tracks 46.

In the above example about ten M1 interconnect tracks are required in the X direction to form a complex macro cell. In addition to the macro cell interconnect resources, additional routing resources (two M1 tracks) are required to distribute power (Vdd) and ground (Vss) to the basic cells. Thus, a total of 12 routing tracks are required, which determines one of the dimensions of the basic cell. In the other direction, at least three tracks are required to contact the source/drain of the two transistor pairs. In addition, one vertical track is required to connect power/ground to the silicon substrate which is shared between a pair of adjacent basic cells. Thus, the overall basic cell is made large enough to allow twelve tracks in X direction and three and a half tracks in Y direction. In this example, it is not possible to make the cell dimensions smaller without significant loss in the macro cell routability.

The large vertical size of the cell results in larger transistors (about four tracks high); This translates to more power consumption per basic cell, and higher load capacitances that slow down the circuits.

Several variations to the above basic cell have been proposed. For example, the horizontal power and ground routes can be shared between adjacent rows of basic cells to reduce the number of horizontal tracks from twelve to eleven. Also, by placing the substrate contact outside the basic cell and under the shared power and ground tracks, the cell width is reduced from 3.5 to 3. However, the cell is still eleven tracks high and has higher resistance in series with the power supply.

In an another variation disclosed in U.S. Pat. No. 5,079,614 issued to M. Khatkhotan and assigned to S-MOS Systems inc., the gate electrodes are interleaved with respect to the diffusion regions to achieve better routability.

However, the basic cell in this case is still over ten tracks by nine tracks, or ninety grid points. In a publication by Y. Okuno et al titled, "0.8 um 1.4 million transistor CMOS SOG based on column macro cell", the authors disclose a novel basic cell and routing approach where the direction of first layer routes is made parallel to the gate electrodes, as opposed to perpendicular as in other prior art. The result is claimed to provide better global routing. The basic cell size, however, is 11×9 tracks, or 121 grid points.

Other prior art patents and publications such as U.S. Pat. No. 4,884,115 have disclosed basic cells in which additional small transistors are included to optimize implementation of static random access memory (SRAM) cells. These cells are significantly larger than the four transistor basic cell of FIG. 2. Similarly, inclusion of a bipolar transistor in addition to CMOS transistors is disclosed in U.S. Pat. No. 5,072,285 issued to Ueda et al. Such basic cell allows formation of BiCMOS macro cells comprising of both CMOS and bipolar transistors. These BiCMOS cells again are significantly larger than pure CMOS basic cells.

In U.S. Pat. No. 5,289,021 issued to El Gamal, and assigned to SiArc Inc., three different sized transistors of P and N type are included in the basic cell. Such a cell allows more efficient design of certain large macro cells such as D flip-flop or latch. The basic cell in this case is about 11 tracks by 11 tracks, or 121 grid points. The large basic cell takes up more area and reduces the granularity of the cell placement on the IC.

All of the above prior art is based on orthogonal arrangement of first and second level tracks. This avoids the blockage of second level tracks that run orthogonal to the macro cells. Since only first level tracks are used for horizontal routing of macro cells, the basic cell must provide eleven to twelve tracks in the horizontal direction, resulting in a large basic cell.

There is a need for more compact cell architectures and more flexible routing schemes in cell based circuits.

SUMMARY OF THE INVENTION

The present invention provides more compact and flexible cell architecture with improved routability for gate array and standard cell design applications. The novel cell employs a new diffusion and gate contact arrangement to reduce cell dimensions. The invention also discloses a novel routing scheme to provide sufficient routing resources necessary to design more complex macro cells more efficiently.

The diffusion and gate contact arrangement according to the present invention employs a non-rectangular diffusion shape in which certain contacts for the gate electrodes in the basic cell are positioned along the same axis as the source/drain diffusion contacts. This approach reduces the number of routing tracks and hence the cell size, while providing sufficient contact regions. The non-rectangular diffusion shape also makes it possible to include an additional small transistor in the basic cell without incurring significant additional area. This additional transistor allows an efficient implementation of memory cells.

This invention further offers a novel routing scheme in which the first two interconnect layers run in the same direction to meet the routing requirements of macro cells. The result is a family of macro cells which is at least two tracks smaller than conventional cells. This not only results in lower manufacturing cost, but also reduces the width of the transistor to reduce device load capacitance and power dissipation.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 5:
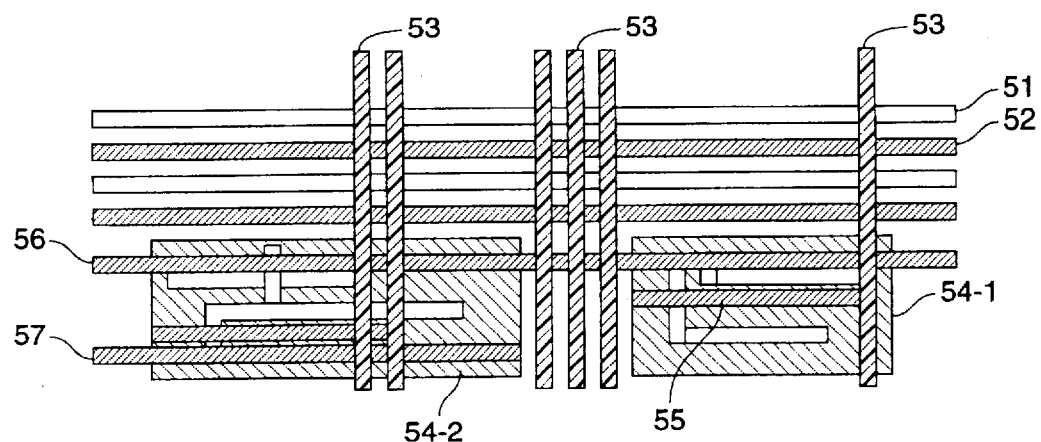
FIG. 5 shows an exemplary cell layout illustrating the routing scheme according to this invention.

Referring to FIG. 5, here is shown an exemplary cell architecture and routing scheme according to this invention. Global routing tracks 51 and 52 in interconnect levels M1 and M2, respectively, extend along the same direction, with M2 tracks above M1 tracks. Although the track pitches for M2 and M1 are shown to be the same in FIG. 5 for convenience, they could be different. Macro cells 54 are formed using horizontal tracks in both M1 and M2 layers to interconnect basic cells. M1 tracks are also used for vertical interconnects within basic cells.

Interconnect level three (M3) tracks 53 run orthogonal to M1 and M2 tracks and can cross over macro cells in any place, since M3 tracks are generally not used internally to construct macro cells. Second layer (M2) global tracks 56 and 57 are also allowed to run over macro cells 54, but only in places where they are not blocked by internal M2 tracks 55 used in constructing the macro cells. In the current invention, by combining M2 and M1 tracks in one direction and using M3 in the other direction, the number of available tracks in the two directions is better balanced.

The routing within the macro cell 54-1 also includes first layer M1 for horizontal as well as vertical interconnections.

However, since M2 global tracks are parallel to M1, it is possible to use M2 tracks 55 for horizontal connections between basic cells to form a complex macro cell. In the prior art, M2 could not be used for horizontal interconnections inside the macro cell. Since both M1 and M2 can be used for horizontal routing inside the basic cell of the present invention, it is possible to reduce the height of the basic cell from 11 tracks to 9 tracks; this results in over 20 percent reduction in the basic cell size.

Figure 1:
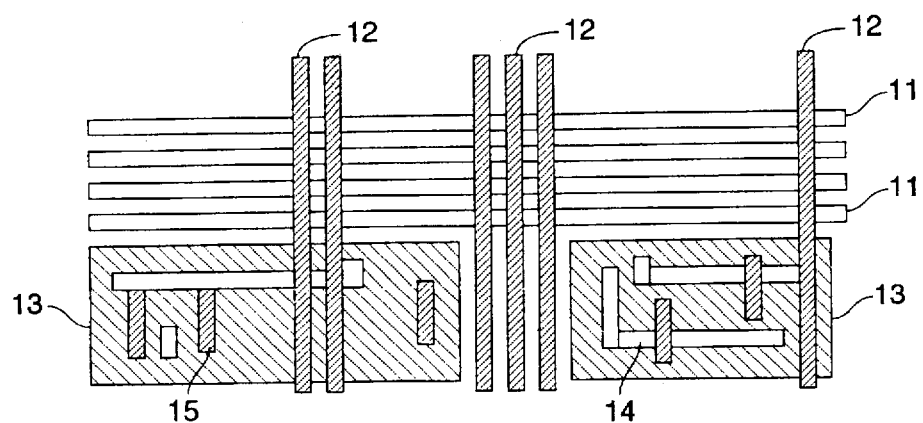
FIG. 1. shows the routing scheme used by prior art gate array and standard cell designs.
Figure 2:
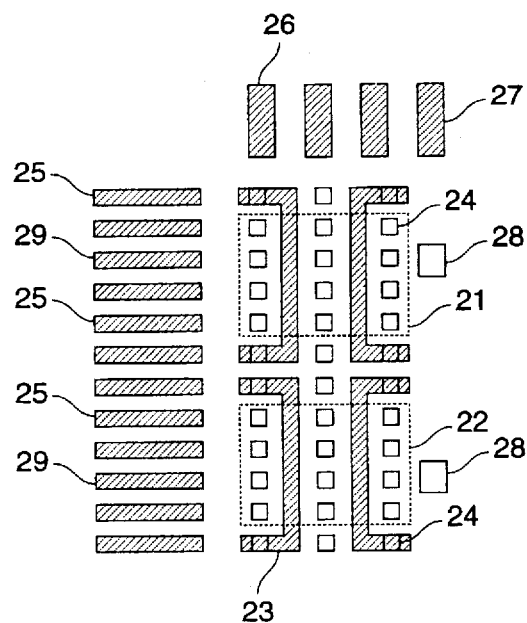
FIG. 2 a prior art basic cell having a pair of P-type and N-type CMOS transistors.
Figure 3:
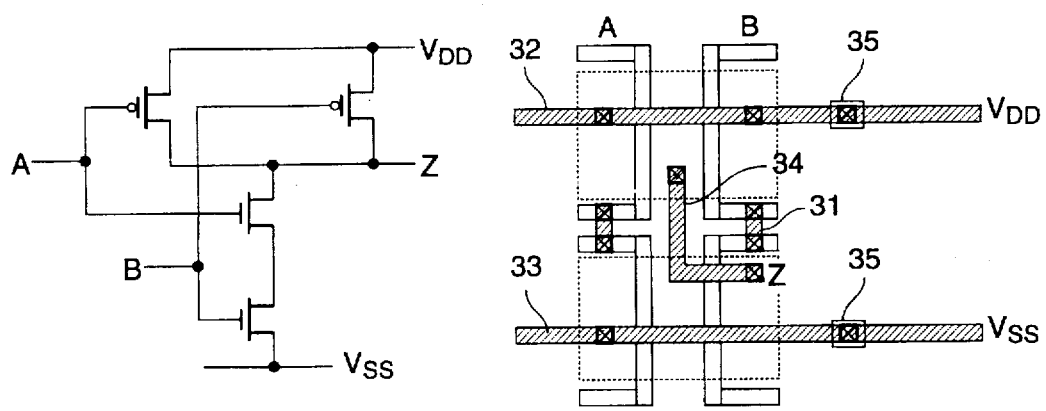
FIG. 3 shows the interconnection scheme to create a 2-input NAND macro cell from the basic cell of FIG. 2.
Figure 4:
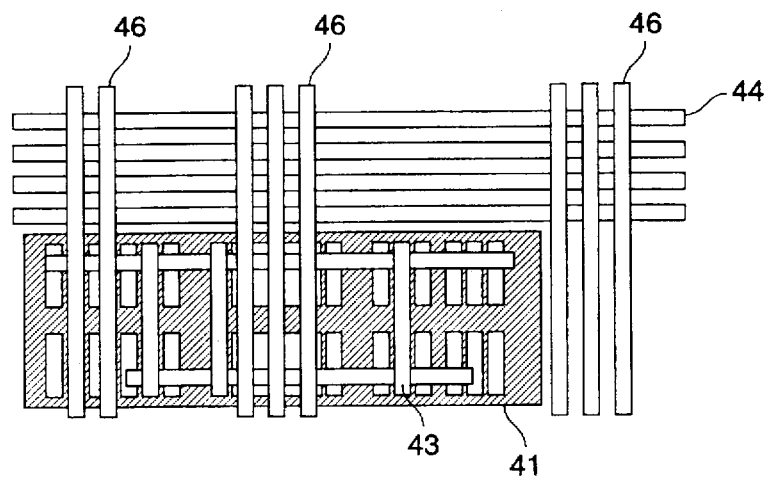
FIG. 4 shows a prior art example of the design and placement of a complex macro cell.

Taking advantage of the increased number of horizontal routing tracks, the basic cell provides adequate connections between the source, drain and gate terminals and the routing tracks. This is best illustrated by the exemplary implementation of a basic cell shown in FIG. 6. P-type and N-type active diffusion regions 66 and 67 have been layed out with non-rectangular outlines to allow for a compact design. The basic cell in FIG. 6 has only nine M1 horizontal tracks 61 and 62, out of which seven tracks 61 are generally used for macro cell routing and the remaining two tracks 62 are used to carry power supplies Vdd and Vss. Substrate contacts 63 for P-type and N-type substrate are placed in diagonal corners under the power tracks. The substrates can thus connect to power supply tracks without using up additional routing tracks. The gate electrodes 64 are shared between PMOS and NMOS transistors to eliminate the routing track required to connect them together (see track 31 in FIG. 3). Each gate electrode has two places where it can be connected to M1 tracks. Source/drain contacts share the same horizontal tracks as gate and substrate contacts to minimize the height of the basic cell. In this example, there are three vertical M3 tracks 65 per basic cell.

Figure 6:
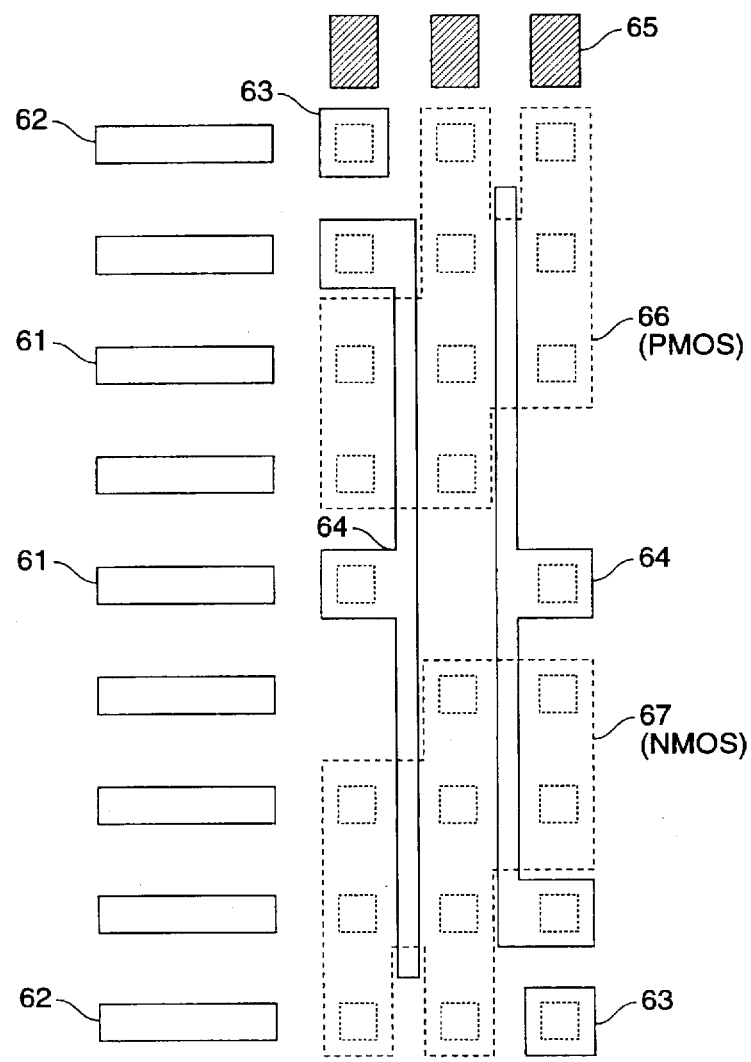
FIG. 6 shows one exemplary embodiment for a basic cell according to this invention.
Figure 7:
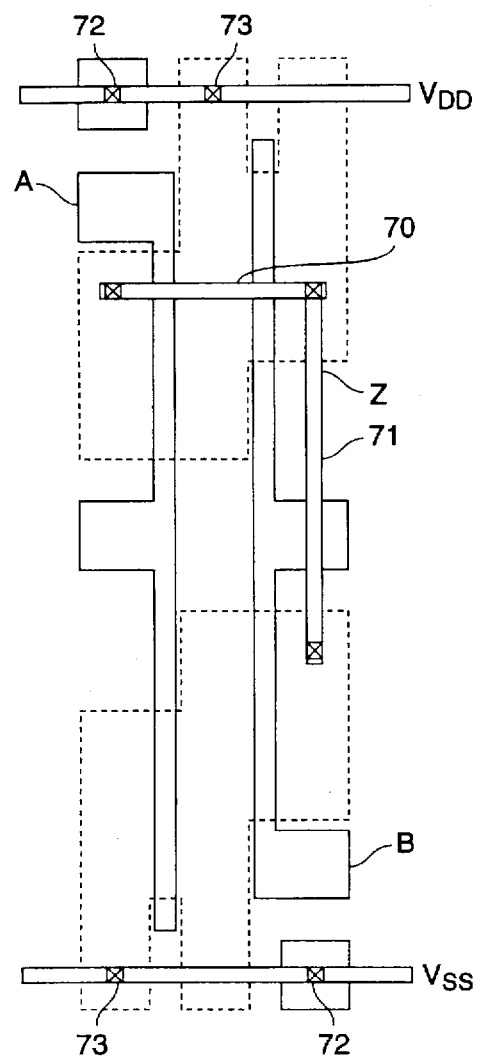
FIG. 7 shows an exemplary interconnection scheme for a 2-input NAND gate using the basic cell and routing scheme of the present invention.

A 2-input NAND gate implementation using the basic cell of FIG. 6 is shown in FIG. 7. Nodes A and B are the two inputs, and node Z is the output of the 2-input NAND gate. First layer (M1) routes 70 and 71 are used to interconnect two PMOS and one NMOS transistors to form the output Z. Vdd and Vss connect to the source terminals of the transistors through contacts 73, and the substrate through contacts 72. Because of the reduced amount of routing required, M2 tracks are not used in 2-NAND and are all available for global routing.

One additional advantage of the present invention is that the three input/output terminals (A,B and Z) of the 2-NAND cell can be accessed by seven different M2 tracks. In the prior art shown in FIG. 3, only three M2 tracks are available to access the three cell terminals. The increased access allows more flexibility in global routing and hence increased routability.

Figure 8:
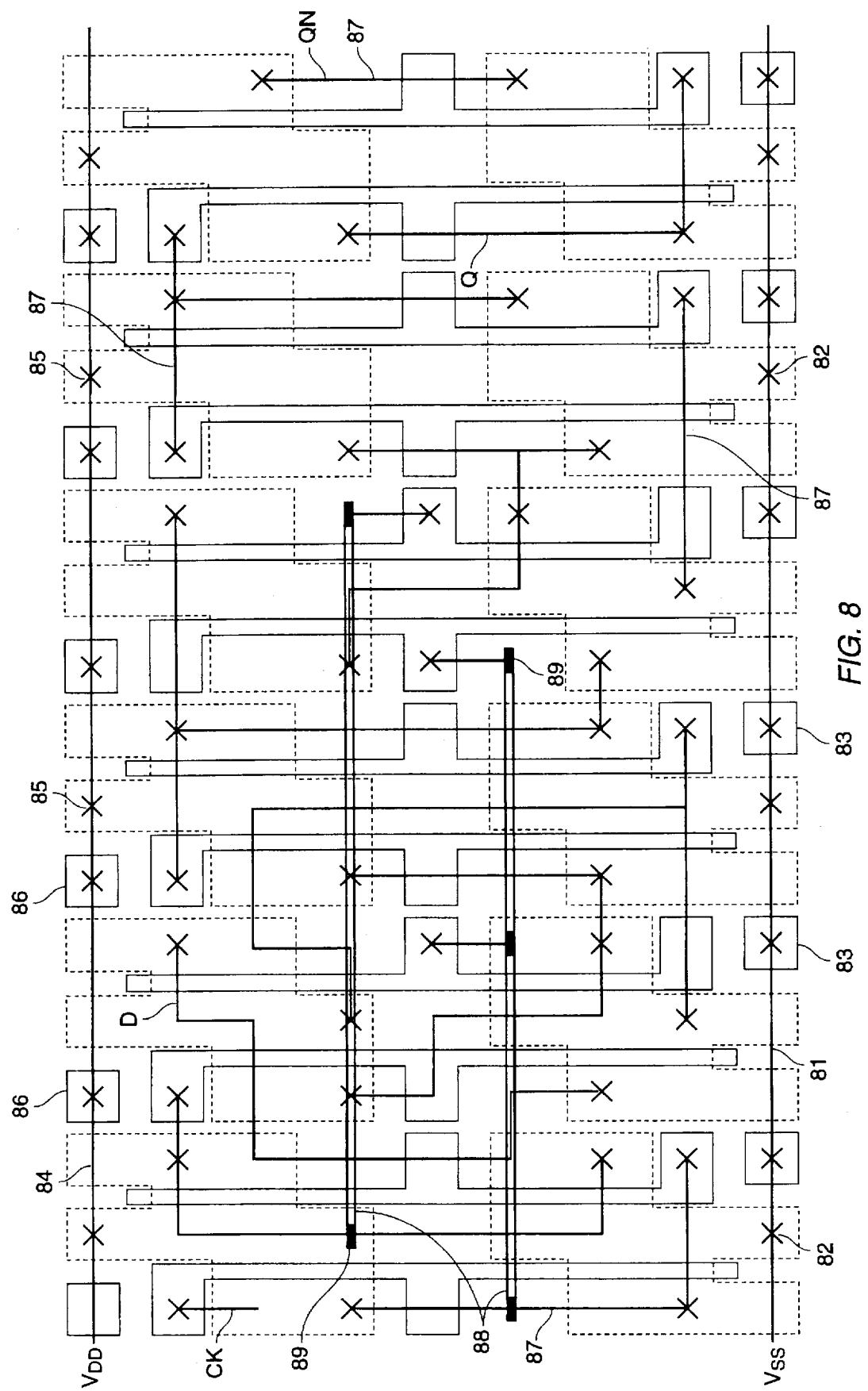
FIG. 8 shows an exemplary interconnection scheme for a D flip-flop using the basic cell and routing scheme of the present invention.

In FIG. 8, implementation of a D-type flip-flop using the teachings of the present invention is shown. D and CK are data and clock inputs respectively and Q and QN are true and complementary outputs of the flip-flop. The flip-flop occupies six basic cells and requires two M2 tracks 88 in addition to M1 tracks 87 to interconnect them. Interconnect layer two (M2) is connected to interconnect layer one (M2) tracks through via contacts 89. Although M2 tracks are placed above M1 tracks in real devices, the order is reversed in FIG. 8 for clarity. The positive power supply Vdd track 84 connects to P-channel transistors through contact 85 and to substrate through contacts 86. The negative power supply Vss track 81 connects to N-channel transistors through contacts 82 and to substrate through contacts 83. This implementation of the D-type flip-flop is over 25% smaller than prior art.

Figure 9:
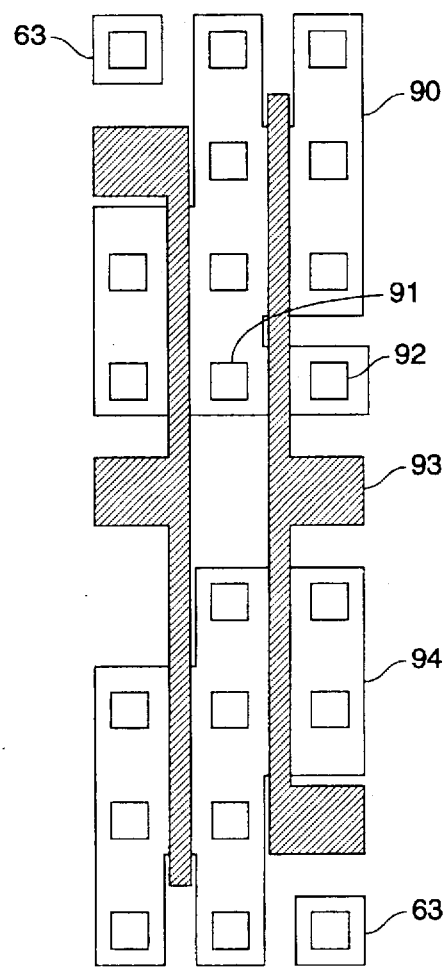
FIG. 9 shows another exemplary embodiment of the basic cell according to the principals of this invention wherein a small transistor is added to facilitate memory cell implementation.
Figure 10A:
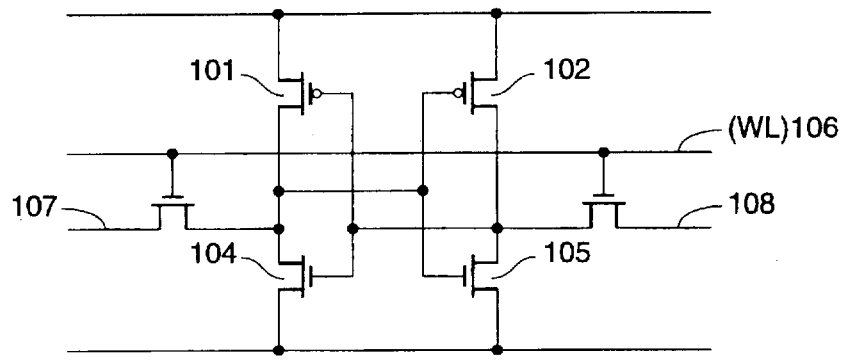
FIG. 10 shows a static random access memory (RAM) cell implemented using the basic cell shown in FIG. 9.
Figure 10B:
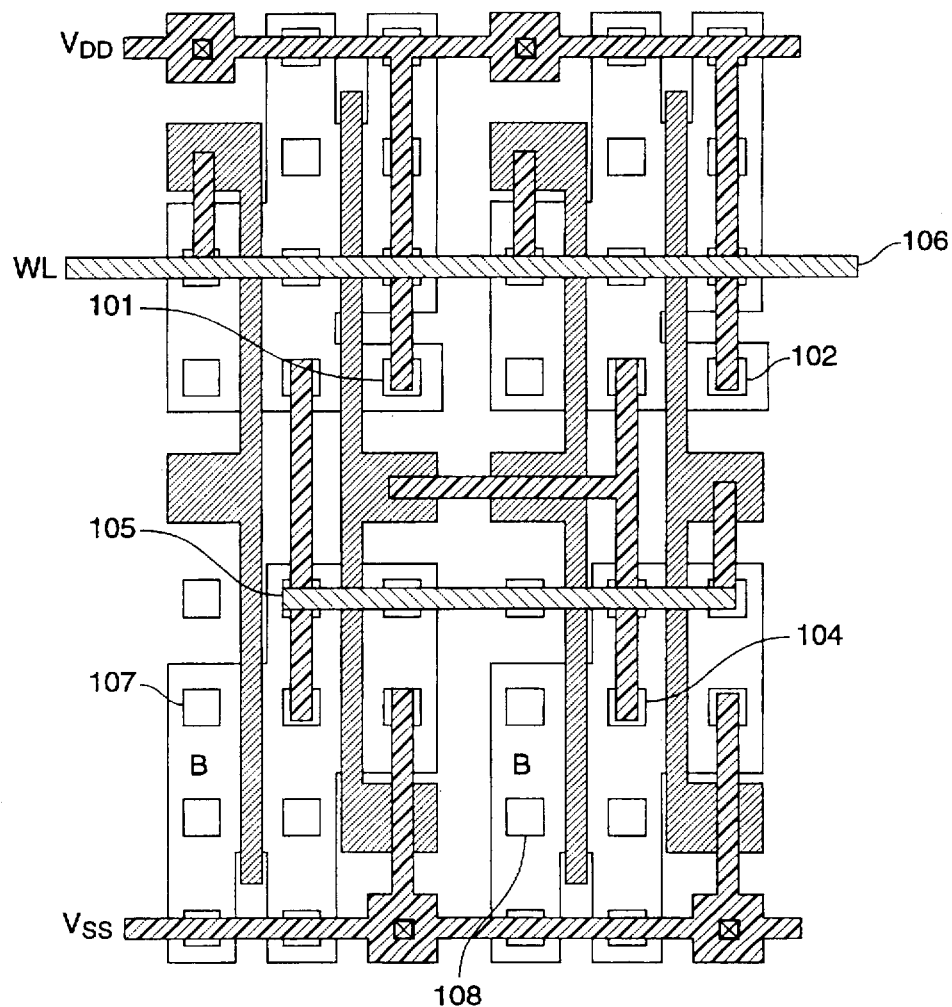

FIG. 9 shows another exemplary embodiment for a basic cell according to this invention. In this case, the P-type active region diffusion 90 is extended to create an additional small P channel transistor 91/92 controlled by gate electrode 93. A similar modification to the N-type active diffusion 94 can also provide an additional small N channel transistor. The inclusion of the additional transistor does not increase the number of tracks in the basic cell. The small P channel transistor is useful in implementing Static RAM (SRAM) cells as shown in FIG. 10. Referring to FIG. 10, the small P channel transistors 101 and 102 are used as load devices to the cross-coupled inverters 104 and 105. The SRAM cell is addressed by Word Line (WL) 106 and outputs are available on nodes 107 and 108. Without the small transistor, the load device will have to be made from series connection of two large P channel transistors, resulting in a 50 percent larger and slower memory cell.

Figure 11:
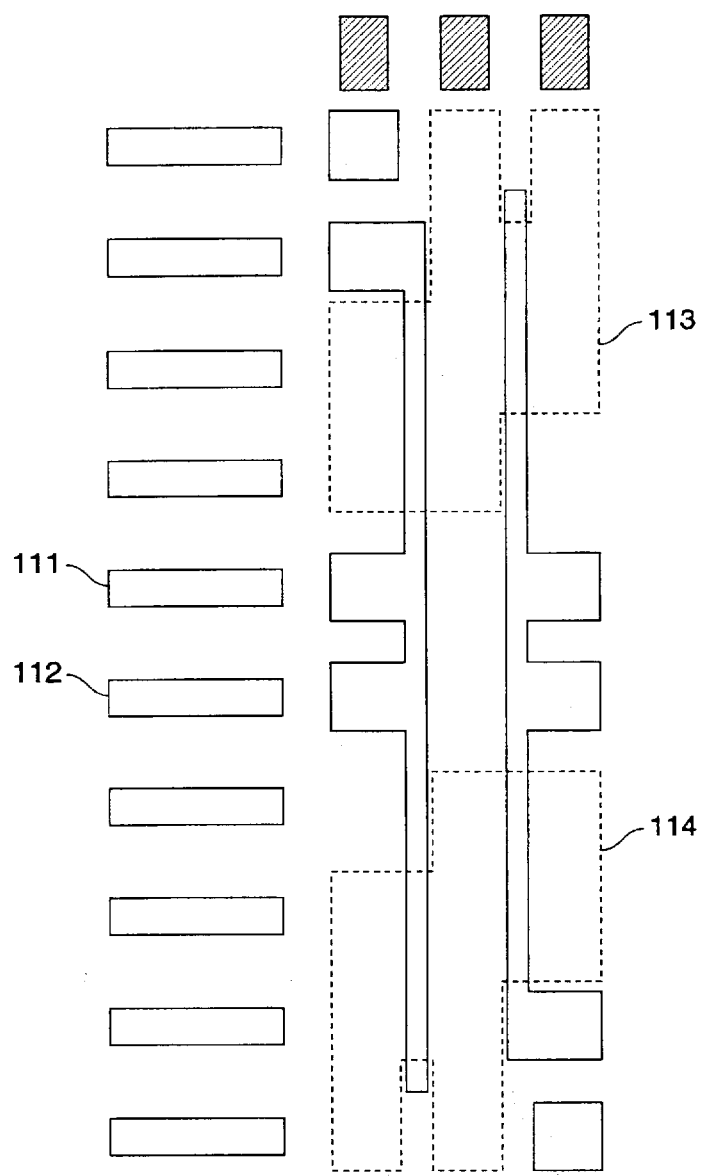
FIG. 11 is another embodiment of the basic cell according to this invention which has two tracks between P-type and N-type transistors to allow more relaxed design rule.

FIG. 11 shows an alternate implementation of the basic cell. In this case, two horizontal tracks 111 and 112 are placed between P-type and N-type active regions 113 and 114, respectively. The result is a 10 track by 3 track cell with relaxed demands on the design rules.

Figure 12:
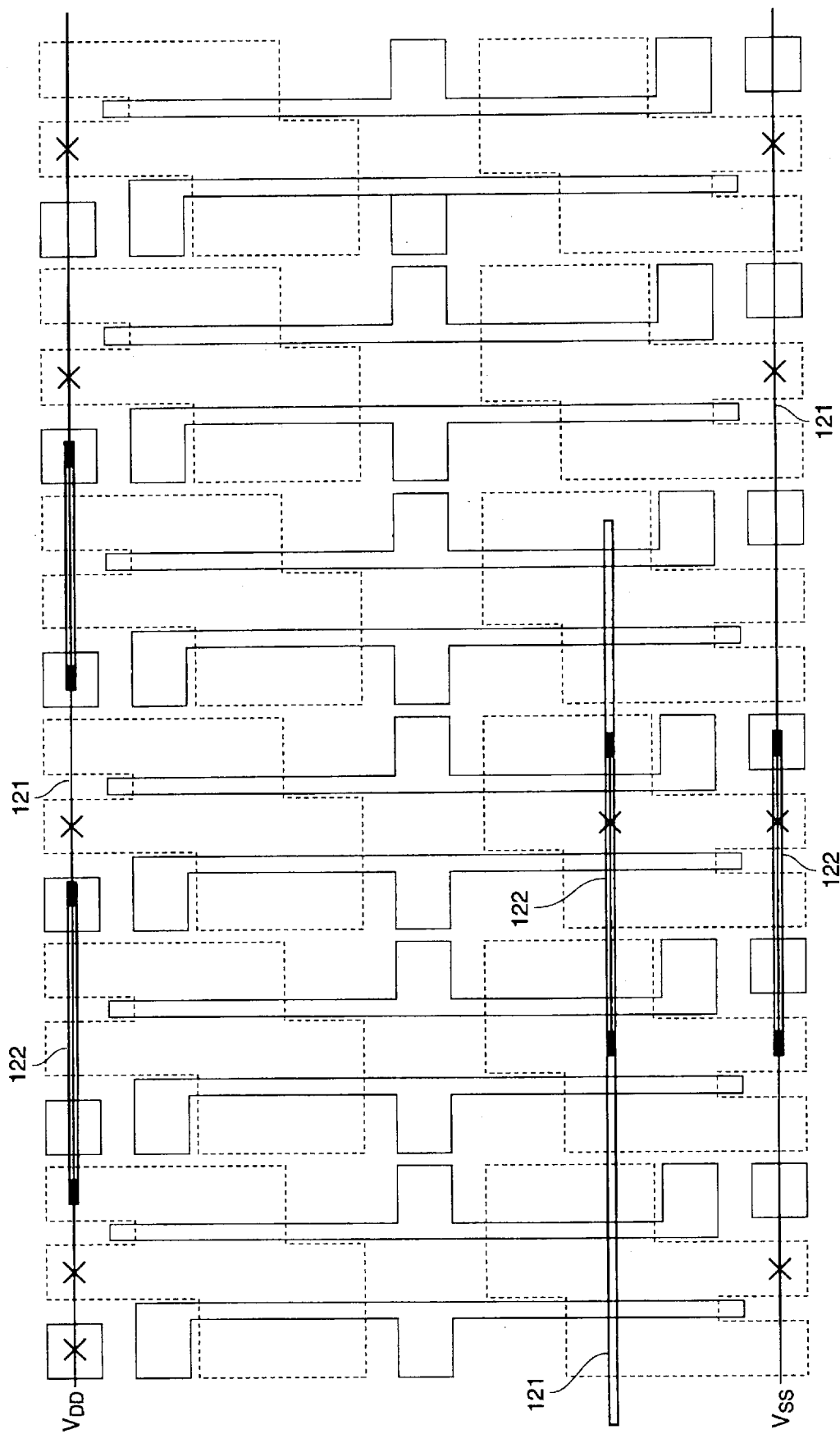
FIG. 12 shows parallel connection of M1 and M2 in selected places to lower wire resistance in power supply lines and long signal lines according to the principals of this invention.

One additional advantage of the current invention is shown in FIG. 12, where parallel connection of M1, 122 and M2, 121 tracks is used to reduce wire resistance in critical lines. Wire resistance is a significant contributor to delay in long signal lines. Additionally, series resistance in power tracks can slow down switching speeds and reduce noise margin. In such cases, or in instances where unused M1 or M2 tracks are available, the two metal tracks can be connected together to reduce series resistance. This parallel connection of tracks from two different levels can be done in the present invention without blocking other routing tracks. In the prior art, parallel connection is not possible without significant blockage of routing tracks. In the prior art, if M2 is used to parallel connect to M1, typically all the M2 tracks that run orthogonal to the length of connection will be blocked. On the other hand, if M3 is used to parallel connect to M1, M2 tracks must be used to provide connections between M1 and M3, thus blocking those M2 tracks.

Figure 13:
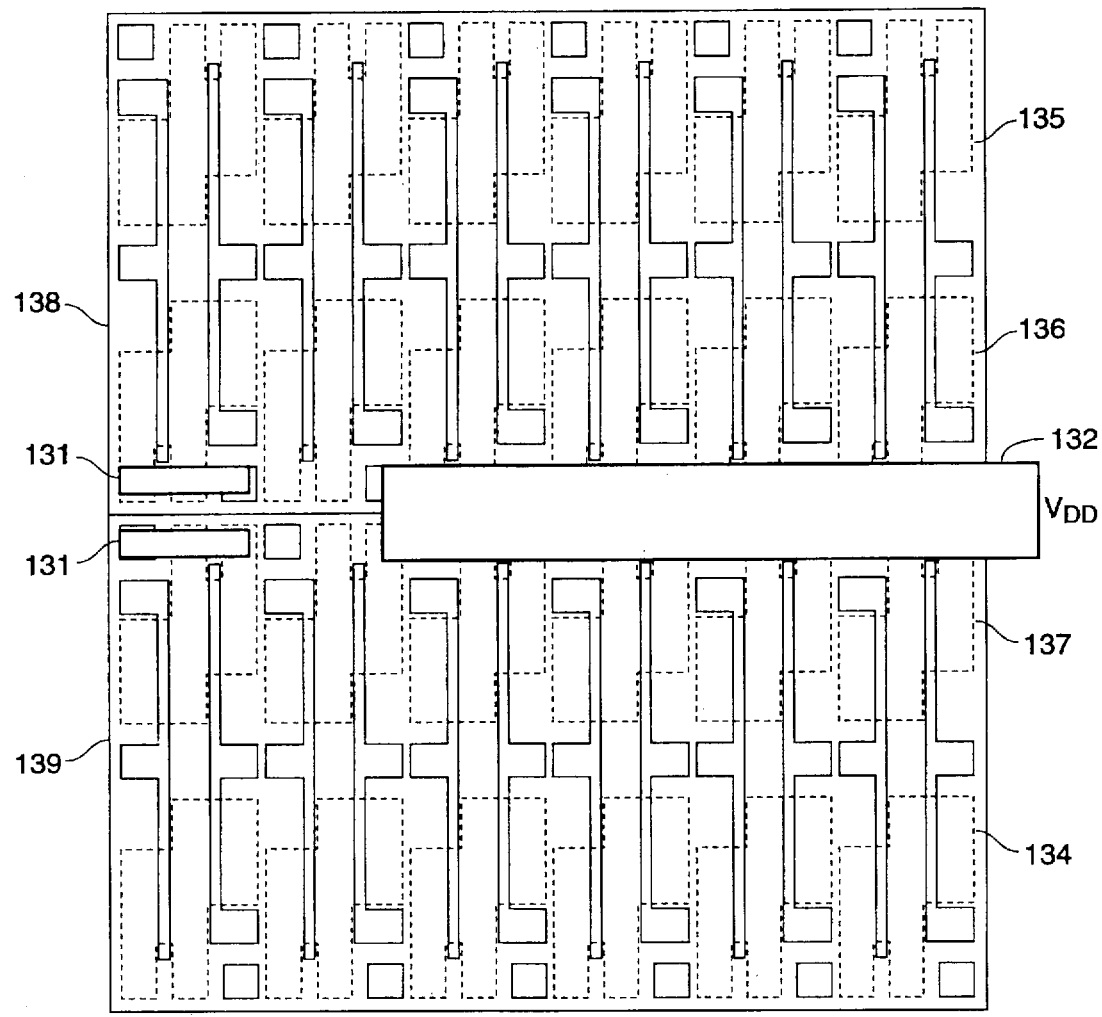
FIG. 13 shows an exemplary preferred power distribution arrangement according to this invention which reduces series resistance by 50%.

In FIG. 13, an innovative power supply connection scheme for the basic cells disclosed in this invention is shown. Two rows of basic cells 138 and 139 are shown, one above the other. However, the top row 138 is inverted in relation to the bottom row 139 such that the P-type (N-type) transistors 136, 137 in each group are adjacent to each other. In the next rows, NMOS transistors 134 and 135 will be adjacent to other NMOS transistors. The prior art power distribution scheme is shown on the left side, where two parallel tracks 131 are used to distribute power to the two cells, each with a resistance R. In the present invention, the two power tracks are replaced by a single track 132 that is three tracks wide. This does not require additional area since it occupies the empty space between two tracks. The wider track effectively reduces the series resistance of the power supply to each basic cell by 50%.

While this invention has been described in conjunction with several specific embodiments, it is evident to those skilled in the art that many alternatives, modifications and variations will be apparent in light of the foregoing descriptions. Specifically, although the invention has been described with reference to gate arrays, it is fairly straight forward to apply the routing methodology and cell structure to standard cell and general cell based design methodologies. Thus, the invention described herein is intended to embrace all such alternatives, modifications, applications and variations as fall within the spirit and scope of the appended claims.

What is claimed is:

1. A circuit layout architecture for an integrated circuit using cells comprising:

a first group of global interconnect lines made from a first conductive layer and disposed along a first direction;

a second group of global interconnect lines made from a second conductive layer above said first conductive layer, and disposed along said first direction;

a third group of global interconnect lines made from a third conductive layer above said second conductive layer, and disposed along a second direction substantially different than said first direction; and a plurality of basic cells, each one including diffusion regions for transistor source and drain terminals, gate electrode regions for transistor gate terminals, and contact regions for making electrical contact to said diffusion and gate electrode regions, wherein, a macro cell is made by interconnecting adjacent basic cells, and interconnections internal to a macro cell are made using interconnect lines from said first and second conductive layers, and wherein, said plurality of macro cells are selectively coupled together via said first, second and third group of interconnect lines, wherein each one of said plurality of basic cells comprises a first diffusion region of a first type and a second diffusion region of a second type, and wherein said first and second diffusion regions are laid out in a non-rectangular shape, wherein each of said plurality of basic cells comprises a first and second gate electrode regions, each one of which is shared between a transistor made in said first diffusion region and a transistor made in said second diffusion region, wherein each of said plurality of basic cells has a substantially rectangular shape with a first and second substrate contact regions disposed in corners, and wherein said substantially rectangular shape of each of said plurality of basic cells has a first dimension defined by only nine interconnect lines made from said first conductive layer disposed in parallel in said first direction, and a second dimension defined by only three interconnect lines made from said third conductive layer disposed in parallel in said second direction.

2. The circuit layout architecture of claim 1, wherein said first and second gate electrode regions form a first and second transistors in each one of said first and second diffusion regions, and wherein said first diffusion region is extended to form a PMOS transistor.

3. The circuit layout architecture of claim 2, wherein said second diffusion region is extended to define an NMOS transistor.

4. The circuit layout architecture of claim 1, wherein said first dimension is made larger to accommodate a tenth interconnect line to define ten interconnect lines made from said first conductive layer and disposed in said first direction, said first and second diffusion regions being separated by a minimum width of two of said ten interconnect lines.

5. The circuit layout architecture of claim 1, wherein a first interconnect line from said first conductive layer makes contact to an interconnect line from said second conductive layer immediately above said first interconnect line forming a double-layer parallel interconnect line to reduce resistance.

6. A layout architecture for an integrated circuit using cells comprising:

a first group of global interconnect lines made from a first conductive layer and disposed along a first direction;

a second group of global interconnect lines made from a second conductive layer above said first conductive layer, and disposed along said first direction;

a third group of global interconnect lines made from a third conductive layer above said second conductive layer, and disposed along a second direction substantially different than said first direction; and a plurality of basic cells, each one including diffusion regions for transistor source and drain terminals, gate electrode regions for transistor gate terminals, and contact regions for making electrical contact to said diffusion and gate electrode regions, wherein, a macro cell is made by interconnecting adjacent basic cells, and interconnections internal to a macro cell are made using interconnect lines from said first and second conductive layers, and wherein, said plurality of macro cells are selectively coupled together via said first, second and third group of global interconnect lines, wherein each one of said plurality of basic cells comprises a first diffusion region of a first type and a second diffusion region of a second type, and wherein said first and second diffusion regions are laid out in a non-rectangular shape, wherein each of said plurality of basic cells comprises a first and second gate electrode regions, each one of which is shared between a transistor made in said first diffusion region and a transistor made in said second diffusion region, wherein each of said plurality of basic cells has a substantially rectangular shape with a first and second substrate contact regions disposed in corners, wherein a first group of said plurality of basic cells are disposed adjacent to each other to form a first row of basic cells, and a second group of said plurality of basic cells are disposed adjacent to each other to form a second row of basic cells, wherein, said first row is disposed above said second row such that a diffusion region of said first type in a basic cell within said first row is placed laterally adjacent to a diffusion region of said first type in a basic cell within said second row, and wherein, an interconnect line from said first layer at least twice the minimum width of an interconnect line from said first layer extends in the first direction over said substrate contact regions in basic cells of both said first and second rows.

7. A basic cell for arrangement in rows for use in an integrated circuit using cells comprising:

a P-type active diffusion region having a non-rectangular outline;

an N-type active diffusion region having a non-rectangular outline;

a first gate electrode extending across said P-type and N-type active diffusion regions in a first direction separating source contact regions and drain contact regions of a first PMOS transistor and separating source contact regions and drain contact regions of a first NMOS transistor, respectively;

a second gate electrode extending across said P-type and N-type active diffusion regions in said first direction separating source contact regions and drain contact regions of a second PMOS transistor and separating source contact regions and drain contact regions of a second NMOS transistor, respectively, said first gate electrode having a first end and a opposing second end, said first end having a contact region laterally adjacent said P-type active diffusion region, said second end having no contact region, said first gate electrode having contact at an intermediate contact region, and said second gate electrode having a third end and an opposing fourth end, said third end having a contact region laterally adjacent said N-type active diffusion region, said fourth end having no contact region, said second gate electrode having contact at an intermediate contact region.

8. The basic cell of claim 7 further comprising:
a substrate contact region and first active diffusion contact region and second active diffusion contact region,
wherein, an overall shape of the cell is substantially defined by a rectangle with a first dimension along said first direction and a second dimension along a second direction, and
wherein, said substrate contact region is disposed along the same axis as said first active diffusion contact region in said first direction, and said gate electrode contact region is disposed along the same axis as said second active diffusion contact region in said second direction.

9. The basic cell of claim 8 wherein said substrate contact region further comprises a first substrate contact region and a second substrate contact region each disposed in corners of said rectangle.

10. The basic cell of claim 9 wherein a length of said first dimension is substantially defined by nine second-layer interconnect lines of minimum dimension and spacing extending in parallel in said second direction, and a length of said second dimension is substantially defined by three third-layer interconnect lines of minimum dimension and spacing extending in said first direction.

11. The basic cell of claim 8, wherein, in said first direction, each said P-type active diffusion region comprises at least four active diffusion contact regions in a central section, two active diffusion contact regions in a first lateral region separated by said first gate electrode, and at least three active diffusion contact regions in a second lateral region separated by said second gate electrode.

12. The basic cell of claim 7 wherein first metal interconnect lines are made from a first conductive layer and are disposed in said second direction and wherein second metal interconnect lines are made from a second conductive layer over said first conductive layer in said second direction, and wherein third interconnect lines are made from a third conductive layer over said second conductive layer and are disposed in said first direction.

13. A circuit layout architecture for an integrated circuit using cells, said circuit layout architecture comprising:
a cell having a first pair of PMOS and NMOS transistors and a second pair of PMOS and NMOS transistors, said first and second pairs placed adjacent to each other in a first direction and each transistor having a gate electrode extended substantially in a second direction, said second direction being substantially perpendicular to said first direction;
a first interconnect line made from a first conductive layer for making interconnections inside said cell in said first and said second direction;
a second interconnect line made from a second conductive layer above said first conductive layer and separated from said first conductive layer by an insulating layer, said second interconnect line for making interconnections internal and external to said cell in said first direction, wherein said cell has a substantially rectangular shape with a first dimension along said first direction defined by a maximum of three contact regions, and a second dimension along said second direction defined by a maximum of nine contact regions.

14. The circuit layout architecture of claim 13 wherein said cell with substantially rectangular shape further comprises first and second substrate contact regions disposed in corners.

15. The circuit layout architecture of claim 14 wherein said substantially rectangular-shaped cell comprises three columns of contact regions extending along said first direction, and wherein contact regions from a first and a third column are used to connect to gate electrodes for said PMOS and NMOS transistors.

16. An integrated circuit using cells comprising:
a first group of global interconnect lines made from a first conductive layer and disposed along a first direction;
a second group of global interconnect lines made from a second conductive layer above said first conductive layer, and disposed along said first direction;
a third group of global interconnect lines made from a third conductive layer above said second conductive layer, and disposed along a second direction substantially different than said first direction; and
a plurality of basic cells, each one including diffusion regions for transistor source and drain terminals, gate electrode regions for transistor gate terminals, and contact regions for making electrical contact to said diffusion and gate electrode regions,
wherein, a macro cell is made by interconnecting adjacent basic cells, and interconnections internal to a macro cell are made using interconnect lines from said first and second conductive layers, and
wherein, said plurality of macro cells are selectively coupled together via said first, second and third group of global interconnect lines,
wherein each one of said plurality of basic cells comprises a first diffusion region of a first type and a second diffusion region of a second type, and wherein said first and second diffusion regions are laid out in a non-rectangular shape,
wherein each of said plurality of basic cells comprises a first and second gate electrode regions, each one of which is shared between a transistor made in said first diffusion region and a transistor made in said second diffusion region,
wherein each of said plurality of basic cells has a substantially rectangular shape with a first and second substrate contact regions disposed in corners, and
wherein said substantially rectangular shape of each of said plurality of basic cells has a first dimension defined by only nine interconnect lines made from said first conductive layer disposed in parallel in said first direction, and a second dimension defined by at least three interconnect lines made from said third conductive layer disposed in parallel in said second direction.

17. The integrated circuit of claim 16, wherein said first dimension is made larger to add at least a tenth interconnect line to form at least ten interconnect lines made from said first conductive layer and disposed in said first direction, said first and second diffusion regions being separated by a minimum width of two of said at least ten interconnect lines.

18. A circuit layout architecture for an integrated circuit using cells, said circuit layout architecture comprising:

a cell having a first pair of PMOS and NMOS transistors and a second pair of PMOS and NMOS transistors, said first and second pairs placed adjacent to each other in a first direction and each transistor having a gate electrode extended substantially in a second direction, said second direction being substantially perpendicular to said first direction;

a first interconnect line made from a first conductive layer for making interconnections inside said cell in said first and said second direction;

a second interconnect line made from a second conductive layer above said first conductive layer and separated from said first conductive layer by an insulating layer, said second interconnect line for making interconnections internal and external to said cell in said first direction, wherein said cell has a substantially rectangular shape with a first dimension along said first direction defined by a maximum of three contact regions, and a second dimension along said second direction defined by at least ten contact regions.

19. The circuit layout architecture of claim 18 wherein said cell with substantially rectangular shape further comprises first and second substrate contact regions disposed in corners.

20. The circuit layout architecture of claim 19 wherein said cell comprises three columns of contact regions extending along said first direction, and wherein contact regions from a first and a third column are used to connect to gate electrodes for said PMOS and NMOS transistors.

* * * * *

UNITED STATES PATENT AND TRADEMARK OFFICE
CERTIFICATE OF CORRECTION

PATENT NO   :  5,723,883
DATED       :  March 3, 1998
INVENTOR(S) :  Tushar R. Gheewala It is certified that error appears in the above-identified patent and that said Letters Patent is hereby corrected as shown below:

In the inventor's name, please change "Tushar R. Gheewalla" to its proper spelling of --Tushar R. Gheewala--.

Signed and Sealed this

Ninth Day of June, 1998

*Attest:*

BRUCE LEHMAN

*Attesting Officer*    *Commissioner of Patents and Trademarks*